(12) United States Patent
Sakurai et al.

(10) Patent No.: US 12,326,660 B2
(45) Date of Patent: Jun. 10, 2025

(54) PATTERN FORMING METHOD, COMBINED PROCESSING APPARATUS, AND RECORDING MEDIUM

(71) Applicant: Kioxia Corporation, Tokyo (JP)

(72) Inventors: Noriko Sakurai, Yokohama Kanagawa (JP); Kosuke Takai, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 470 days.

(21) Appl. No.: 17/694,290

(22) Filed: Mar. 14, 2022

(65) Prior Publication Data
US 2023/0089980 A1 Mar. 23, 2023

(30) Foreign Application Priority Data
Sep. 17, 2021 (JP) .................... 2021-152450

(51) Int. Cl.
*G03F 7/00* (2006.01)
*H01J 37/317* (2006.01)
*H01L 21/027* (2006.01)

(52) U.S. Cl.
CPC .......... *G03F 7/0002* (2013.01); *G03F 7/0035* (2013.01); *H01J 37/3174* (2013.01); *H01L 21/0273* (2013.01); *H01L 21/0274* (2013.01)

(58) Field of Classification Search
CPC .. G03F 7/0037; G03F 7/0002; H01J 37/3174; H01L 21/0274; H01L 21/0273
See application file for complete search history.

(56) References Cited

U.S. PATENT DOCUMENTS

2016/0240411 A1* 8/2016 Motokawa ........ H01L 21/67167
2019/0278167 A1* 9/2019 Tanabe ................ H01L 21/3086

FOREIGN PATENT DOCUMENTS

EP 2567290 B1 * 7/2019 ............. B82Y 10/00
JP 2014-216594 A 11/2014

OTHER PUBLICATIONS

Damien et al. "Etch Resistance: Comparison and development of etch rate models", Proc. of SPIE vol. 6519, pp. 651912-1 to 651912-11 (Year: 2007).*

* cited by examiner

*Primary Examiner* — Binh X Tran
(74) *Attorney, Agent, or Firm* — Finnegan, Henderson, Farabow, Garrett & Dunner, LLP

(57) ABSTRACT

According to one embodiment, a pattern forming method includes forming an organic film on a processing target material, the organic film comprising a convex part and a remaining film part adjacent to the convex part and thinner than the convex part. The method further includes irradiating the organic film with an electron beam to decrease a dry etching rate of the organic film. The method further includes removing the remaining film part by dry etching of the organic film. The method further includes forming a pattern on the processing target material by dry etching using the organic film from which the remaining film part has been removed as a mask.

11 Claims, 9 Drawing Sheets

PATTERN FORMING METHOD, COMBINED PROCESSING APPARATUS, AND RECORDING MEDIUM

CROSS REFERENCE TO RELATED APPLICATIONS

This application is based upon and claims the benefit of priority from the prior Japanese Patent Application No. 2021-152450, filed on Sep. 17, 2021, the entire contents of which are incorporated herein by reference.

FIELD

Embodiments of the present invention relate to a pattern forming method, a combined processing apparatus, and a recording medium.

BACKGROUND

It is desirable that a sufficient thickness of a resist to be used as a mask in dry etching for forming a pattern on a processing target material is provided to appropriately form the pattern in manufacturing of a replica template to be used in NIL (Nano Imprint Lithography).

DETAILED DESCRIPTION

According to one embodiment, a pattern forming method includes forming an organic film on a processing target material, the organic film comprising a convex part and a remaining film part adjacent to the convex part and thinner than the convex part. The method further includes irradiating the organic film with an electron beam to decrease a dry etching rate of the organic film. The method further includes removing the remaining film part by dry etching of the organic film. The method further includes forming a pattern on the processing target material by dry etching using the organic film from which the remaining film part has been removed as a mask.

Figure 1:
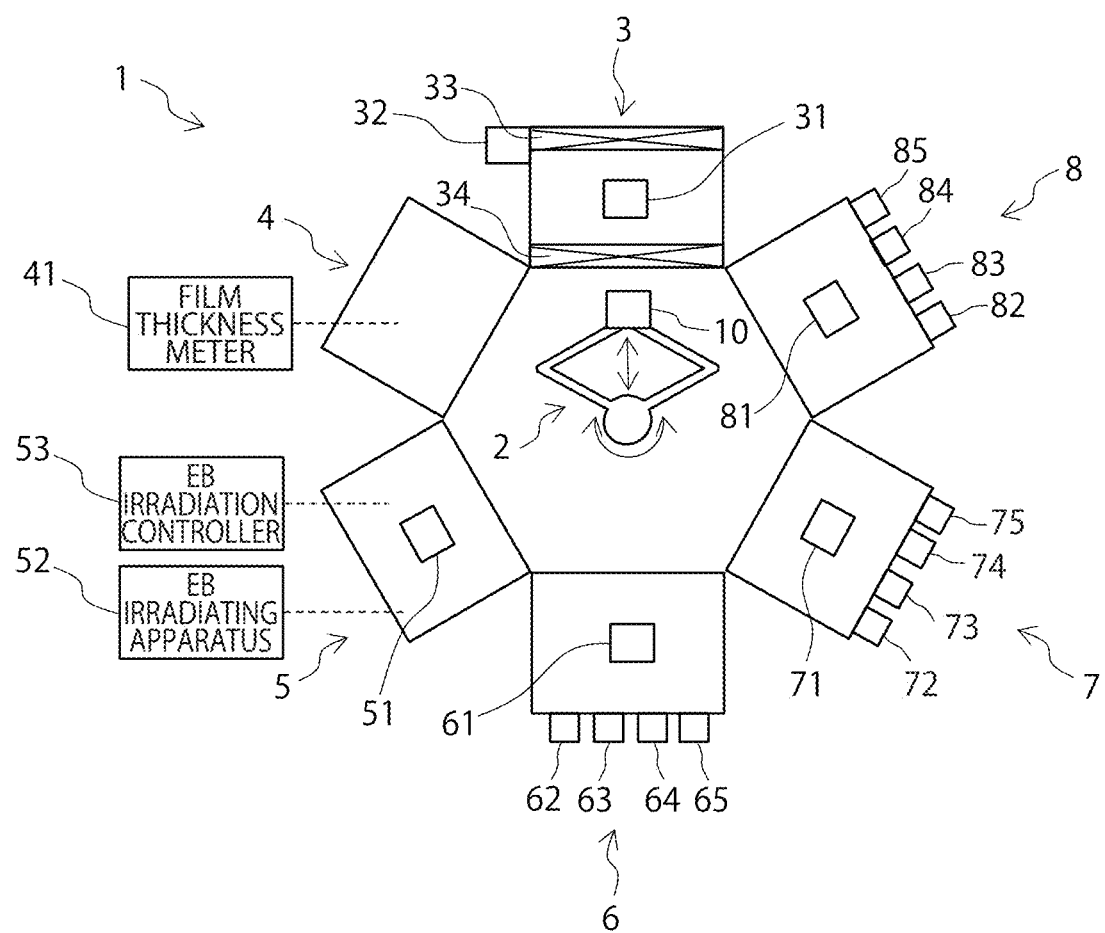
FIG. 1 is a diagram illustrating an example of a combined processing apparatus according to the present embodiment.
Figure 2:
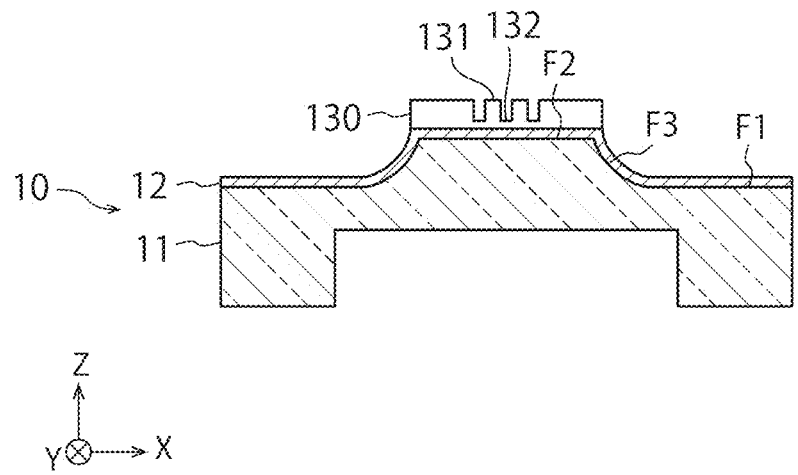
FIG. 2 is a sectional view illustrating a template substrate used in a pattern forming method according to the present embodiment.
Figure 3:
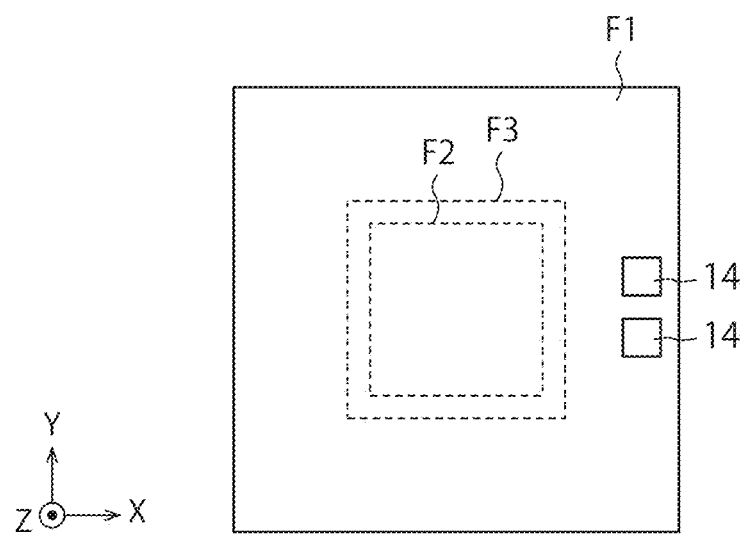
FIG. 3 is a plan view illustrating the template substrate used in the pattern forming method according to the present embodiment.

An embodiment of the present invention is explained below with reference to the drawings. FIG. 1 is a diagram illustrating an example of a combined processing apparatus 1 according to the present embodiment. FIG. 2 is a sectional view illustrating a template substrate 10 used in a pattern forming method according to the present embodiment. FIG. 3 is a plan view illustrating the template substrate 10 used in the pattern forming method according to the present embodiment. The combined processing apparatus 1 illustrated in FIG. 1 can be used in manufacturing of a replica template to be used in the NIL to form a pattern on the template substrate 10 that is the replica template on which the pattern has not been formed yet.

The template substrate 10 is first explained below. As illustrated in FIGS. 2 and 3, the template substrate 10 includes a substrate 11, and a conducting film 12 on the substrate 11. The substrate 11 includes a principal surface F1, a protruded surface F2, and a lateral surface F3. In a state of being transported in the combined processing apparatus 1, a resist film 130 including an organic material such as a light curing resin or a thermosetting resin is formed on the protruded surface F2 of the template substrate 10.

For example, a translucent material such as quartz is used as the substrate 11. The principal surface F1 is a flat surface substantially parallel to an X-Y plane. The protruded surface F2 is protruded in a Z direction from a central part of the principal surface F1 and is a flat surface substantially parallel to the X-Y plane similarly to the principal surface F1. The lateral surface F3 is a surface connecting the principal surface F1 and the protruded surface F2 and is provided along the outer periphery of the protruded surface F2 as illustrated in FIG. 2. The lateral surface F3 is inclined with respect to the protruded surface F2 at least at the connecting part with the protruded surface F2. In the example illustrated in FIG. 2, the lateral surface F3 is inclined to an inner side toward an upper part (in the Z direction). In this way, the substrate 11 has a so-called mesa structure where the protruded surface F2 is protruded from the principal surface F1.

The conducting film 12 is provided on a surface of the template substrate 10 to coat the principal surface F1, the protruded surface F2, and the lateral surface F3. The conducting film 12 on the protruded surface F2 is electrically connected to the conducting film 12 on the principal surface F1 via the conducting film 12 on the lateral surface F3. Since the lateral surface F3 is inclined with respect to the protruded surface F2 and the principal surface F1 as illustrated in FIG. 2, the material of the conducting film 12 can be sufficiently deposited on the lateral surface F3 even when anisotropically sputtered from the Z direction. A conductive material is used for the conducting film 12. The conducting film 12 may include at least one of Cr, Mo, Ta, C, and Si.

As illustrated in FIG. 3, the principal surface F1 and the protruded surface F2 have, for example, a substantially quadrangular shape and have a substantially square shape or a substantially rectangular shape in a planar view seen from the Z direction. Since the lateral surface F3 is provided along the outer periphery of the protruded surface F2 to surround the protruded surface F2, the lateral surface F3 has a frame form in a substantially quadrangular shape. Since the lateral surface F3 is inclined with respect to the protruded surface F2, the whole thereof is seen in the planar view from the Z direction.

In the present embodiment, the conducting film 12 entirely coats the principal surface F1, the protruded surface F2, and the lateral surface F3. The conducting film 12 is provided on the lateral surface F3 on the entire outer periphery of the protruded surface F2 and is provided from the protruded surface F2 to the principal surface F1. Electrodes 14 are connected to a part of the conducting film 12 on the principal surface F1 and can connect the conducting film 12 to ground (a source of reference potential). Accordingly, charges input to the conducting film 12 on the protruded surface F2 at the time of irradiation of the resist film 130 with an electron beam, which will be described later, can be released from the electrodes 14 on the principal surface F1 to the ground through the conducting film 12 on the lateral surface F3.

If the lateral surface F3 includes a substantially perpendicular surface or an inverse tapered surface with respect to the protruded surface F2 or the principal surface F1, the material of the conducting film 12 is unlikely to be formed on the perpendicular surface in the lateral surface F3. In this case, the conducting film 12 on the protruded surface F2 is electrically disconnected from the conducting film 12 on the principal surface F1 and charges input to the conducting film 12 on the protruded surface F2 cannot be released in some cases.

In order to form a pattern on the protruded surface F2 of the template substrate 10, the resist film 130 to which a pattern of a master template 200 (see FIG. 9) described later has been transferred is formed on the protruded surface F2 as illustrated in FIG. 2. As illustrated in FIG. 2, the resist film 130 has a convex (protrusion) part 131 and a remaining film part 132 that is adjacent to the convex part 131 and that is smaller in the thickness than the convex part 131. The thickness can also be referred to as the height in the Z direction. The convex part 131 is a part that functions as a mask in dry etching for processing the template substrate 10 in the resist film 130. The remaining film part 132 is a part to which a convex pattern of the master template 200 has been transferred in the resist film 130. The remaining film part 132 is located on a processing target part of the template substrate 10. The remaining film part 132 is removed by dry etching before dry etching of the template substrate 10.

The resist film 130 having the remaining film part 132 is irradiated with an electron beam. The irradiation with the electron beam can modify the resist film 130 and improve resistance to processing of the resist film 130 (that is, decrease the dry etching rate). However, if charges are accumulated in the conducting film 12 on the protruded surface F2 due to the irradiation with the electron beam and unintended discharge occurs, the template substrate 10 has a risk of being damaged.

In contrast thereto, the conducting film 12 on the protruded surface F2 is electrically connected to the conducting film 12 on the principal surface F1 via the conducting film 12 on the lateral surface F3 due to the inclination of the lateral surface F3 in a forward tapered manner with respect to the principal surface F1 and the protruded surface F2 as illustrated in FIG. 2. Therefore, charges input to the conducting film 12 on the protruded surface F2 can be released to the ground from the electrodes 14. As a result, charge-up of the conducting film 12 on the protruded surface F2 does not occur and accordingly the processing resistance of the resist film 130 can be improved by sufficiently irradiating the resist film 130 with the electron beam.

The combined processing apparatus 1 is explained next. The combined processing apparatus 1 illustrated in FIG. 1 includes a conveyer 2, a carry-in/carry-out processor 3, a film thickness measurement processor 4, an EB (Electron Beam) irradiation processor 5, a first dry etching processor 6, a second dry etching processor 7, and a third dry etching processor 8.

The conveyer 2 transfers the template substrate 10 among the processors of the combined processing apparatus 1 under a reduced pressure. The conveyer 2 includes, for example, a robot arm that is capable of revolving 360 degrees. The inside of the conveyer 2 may be kept at a pressure, for example, equal to or lower than 10 pascals. This enables moisture to evaporate from the resist film 130 formed on the surface of the template substrate 10.

The carry-in/carry-out processor 3 carries the template substrate 10 in the depressurized conveyer 2 from the outside, or carries the processed template substrate 10 to the outside. That is, the carry-in/carry-out processor 3 enables carry-in/carry-out of the template substrate 10 without breaking the depressurized state of the conveyer 2. In the example illustrated in FIG. 1, the carry-in/carry-out processor 3 includes a substrate holder 31 and a controller 32. The substrate holder 31 temporarily stores therein the template substrate 10 carried in from the outside or the processed template substrate 10. The controller 32 controls a carry-in gate 33, a gate valve 34, and a vacuum pump (not illustrated) to perform carry-in and carry-out of the template substrate 10. That is, the controller 32 controls opening and closing of the carry-in gate 33 provided between the outside and the carry-in/carry-out processor 3, opening and closing of the gate valve 34 provided between the conveyer 2 and the carry-in/carry-out processor 3, and the internal pressure of the carry-in/carry-out processor 3. This enables the template substrate 10 to be carried in and out without breaking the depressurized state in the conveyer 2.

The film thickness measurement processor 4 includes, for example, an X-ray diffraction film thickness meter 41. The film thickness measurement processor 4 measures the thicknesses of the convex part 131 and the remaining film part 132 in the resist film 130 using the film thickness meter 41.

The EB irradiation processor 5 includes a substrate stage 51, an EB irradiating apparatus 52 constituted of an electron gun or the like, and an EB irradiation controller 53. The EB irradiation controller 53 controls the EB irradiating apparatus 52 to irradiate the resist film 130 on the template substrate 10 mounted on the substrate stage 51 with an electron beam. The dry etching rate of the resist film 130 is decreased due to irradiation of the resist film 130 with the electron beam.

The EB irradiation controller 53 controls a condition of the electron beam irradiation by the EB irradiating apparatus 52 to cause the decrease amount in the dry etching rate of the remaining film part 132 to be lower than the decrease amount in the dry etching rate of the convex part 131. More specifically, the EB irradiation controller 53 controls the condition of the electron beam irradiation by the EB irradiating apparatus 52 on the basis of the thickness of the convex part 131 and the thickness of the remaining film part 132, which are measured by the film thickness measurement processor 4. For example, the EB irradiation controller 53 acquires in advance dependency (hereinafter, also "film thickness dependency") of the decrease amount in the dry etching rate of the resist film 130 due to the electron beam irradiation on the film thickness of the resist film 130. The EB irradiation controller 53 controls the condition of the electron beam irradiation by the EB irradiating apparatus 52 on the basis of the film thickness dependency, the thickness of the convex part 131, and the thickness of the remaining film part 132. The irradiation condition includes at least one of the accelerating voltage, the irradiation time, and the number of times of irradiation of the electron beam. Due to causing the decrease amount in the dry etching rate of the remaining film part 132 to be lower than the decrease amount in the dry etching rate of the convex part 131, a sufficient thickness of the convex part 131 to appropriately form a pattern can be left at a time when the remaining film part 132 has been removed by the dry etching.

The EB irradiation controller 53 may control the potential of the substrate stage 51. It is preferable that the substrate stage 51 is electrically connected to the template substrate 10. For example, the substrate stage 51 has a connecting conductor and is brought to contact with a part of the template substrate 10. This eliminates a potential difference between the substrate stage 51 and the template substrate 10. The substrate stage 51 may be at a ground potential or may be at a set potential other than the ground potential.

The EB irradiating apparatus 52 includes, for example, an electron ray source such as a hot cathode, a light cathode, or a field emission cathode. A suitable electron ray source may be selected according to the area of electron ray irradiation and the dose amount thereof. For example, a hot cathode of a lanthanum boride (LaB6) may be selected.

The first dry etching processor 6 removes the remaining film part 132 by dry etching of the resist film 130. The first dry etching processor 6 includes a substrate stage 61, a high-frequency power source 62, a pressure control device 63, a mass flow controller 64, and a controller 65. The controller 65 controls the pressure control device 63 and the mass flow controller 64 to cause the inside of the first dry etching processor 6 to have an atmosphere including an etching gas at a predetermined pressure. The controller 65 removes the remaining film part 132 by dry etching, for example, by outputting high-frequency power from the high-frequency power source 62 and exciting plasma between the template substrate 10 mounted on the substrate stage 61 and a high-frequency electrode (not illustrated). The dry etching conditions such as the pressure of the etching gas and the high-frequency power are set to those appropriate for the removal of the remaining film part 132.

The second dry etching processor 7 processes (that is, partially removes) the conducting film 12 by dry etching using, as a mask, the resist film 130 from which the remaining film part 132 has been removed. The second dry etching processor 7 includes a substrate stage 71, a high-frequency power source 72, a pressure control device 73, a mass flow controller 74, and a controller 75. The controller 75 controls the pressure control device 73 and the mass flow controller 74 to cause the inside of the second dry etching processor 7 to have an atmosphere including an etching gas at a predetermined pressure. The controller 75 processes the conducting film 12 by dry etching, for example, by outputting high-frequency power from the high-frequency power source 72 and exciting plasma between the template substrate 10 mounted on the substrate stage 71 and a high-frequency electrode (not illustrated). The dry etching conditions such as the pressure of the etching gas and the high-frequency power are set to those appropriate for the processing of the conducting film 12.

The third dry etching processor 8 forms a pattern on the template substrate 10 including the processed conducting film 12 (that is, the substrate 11 exposed due to partial removal of the conducting film 12) by dry etching using, as a mask, the resist film 130 from which the remaining film part 132 has been removed. The third dry etching processor 8 includes a substrate stage 81, a high-frequency power source 82, a pressure control device 83, a mass flow controller 84, and a controller 85. The controller 85 controls the pressure control device 83 and the mass flow controller 84 to cause the inside of the third dry etching processor 8 to have an atmosphere including an etching gas at a predetermined pressure. The controller 85 forms a pattern on the substrate 11 of the template substrate 10 by dry etching, for example, by outputting high-frequency power from the high-frequency power source 82 and exciting plasma between the template substrate 10 mounted on the substrate stage 81 and a high-frequency electrode (not illustrated). The dry etching conditions such as the pressure of the etching gas and the high-frequency power are set to those appropriate for the processing of the substrate 11.

A pattern forming method to which the combined processing apparatus 1 described above is applied is explained next. In the pattern forming method according to the present embodiment, a plurality of samples are first prepared for each of film thicknesses of plural types of resist films having different film thicknesses (Step S1). Each of the samples is, for example, a resist film having no pattern formed thereon. A pattern or a step may be formed on each of the samples.

After the samples of the resist film are prepared, each of the samples is irradiated with different irradiation amounts of an electron beam by the EB irradiating apparatus (Step S2).

Figure 4:
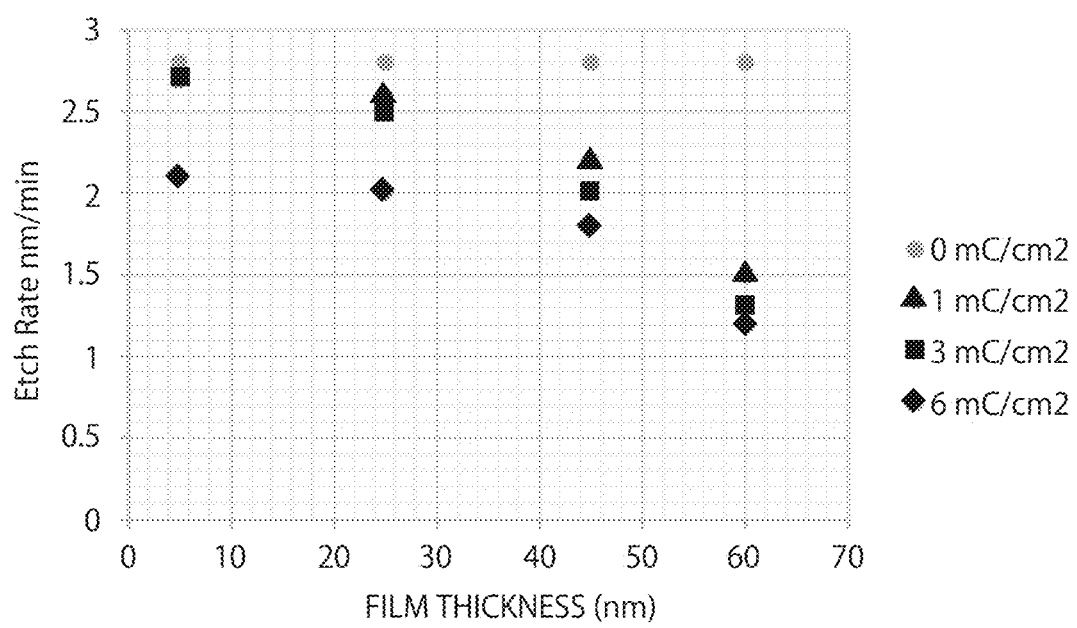
FIG. 4 is a graph illustrating the pattern forming method according to the present embodiment.

FIG. 4 is a graph illustrating the pattern forming method according to the present embodiment. After each of the samples is irradiated with the electron beam, the dry etching rate of each of the samples is acquired by an actual measurement or a simulation and the graph of FIG. 4 is acquired by plotting the acquired dry etching rates (Step S3). In FIG. 4, the horizontal axis represents the sample film thickness (nanometers (nm)) and the vertical axis represents the dry etching rate (nm/min). In the example illustrated in FIG. 4, the film thicknesses of the samples are four kinds of 5 nm, 25 nm, 45 nm, and 60 nm. The irradiation amounts of the electron beam are four kinds of 0 $mC/cm^2$ (that is, no irradiation with the electron beam), 1 $mC/cm^2$, 3 $mC/cm^2$, and 6 $mC/cm^2$. The graph of FIG. 4 indicates the film thickness dependency of the dry etching rate with respect to each irradiation amount. Furthermore, the change amount in the dry etching rate after the electron beam irradiation relative to the dry etching rate before the electron beam irradiation (at the time of 0 $mC/cm^2$) with respect to each film thickness can be seen from the graph of FIG. 4. That is, the graph of FIG. 4 indicates the film thickness dependency of the decrease amount in the dry etching rate of the resist film caused by the electron beam irradiation.

Figure 5:
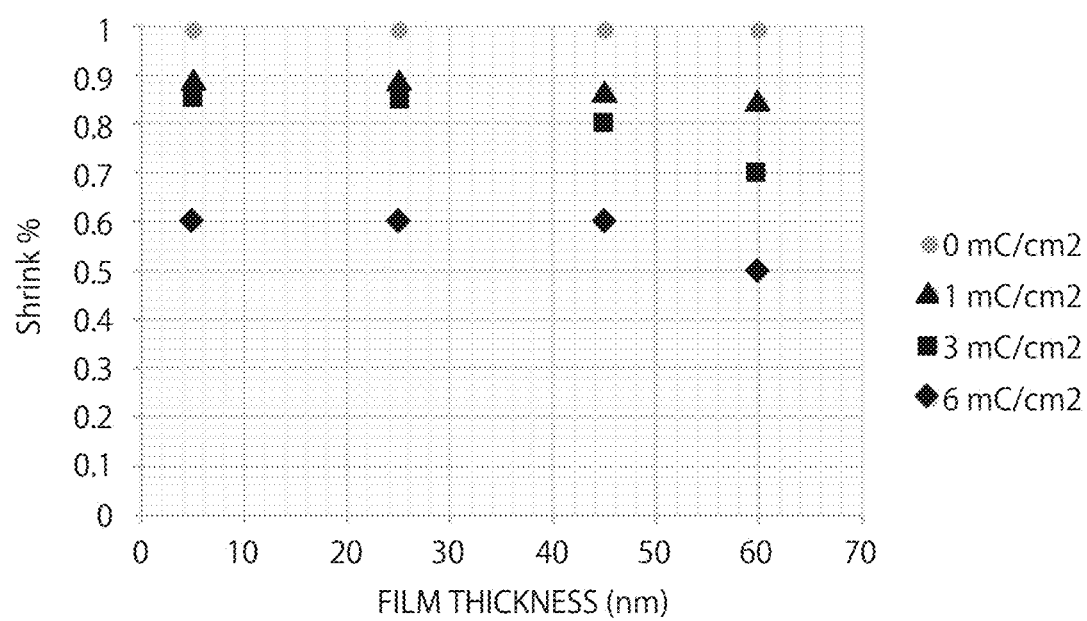
FIG. 5 is a graph illustrating the pattern forming method in continuation from FIG. 4.

FIG. 5 is a graph illustrating the pattern forming method in continuation from FIG. 4. After the graph of the dry etching rate is acquired, the shrinkage ratio of each of the samples is acquired by an actual measurement or a simulation. The shrinkage ratio is the ratio of the film thickness of a sample after the electron beam irradiation with respect to the film thickness of the sample before the electron beam irradiation. The acquired shrinkage ratios are plotted to acquire the graph of FIG. 5 (Step S4). In FIG. 5, the horizontal axis represents the sample film thickness (nm) and the vertical axis represents the shrinkage ratio (%). The graph of FIG. 5 indicates the film thickness dependency of the shrinkage ratio with respect to each irradiation amount. The change amount in the shrinkage ratio after the electron beam irradiation relative to the shrinkage ratio before the electron beam irradiation (at the time of 0 $mC/cm^2$) with respect to each film thickness is seen from the graph of FIG. 5. The acquisition of the graph of FIG. 4 and the acquisition of the graph of FIG. 5 may be performed in the reverse order or may be performed at the same time.

Figure 6:
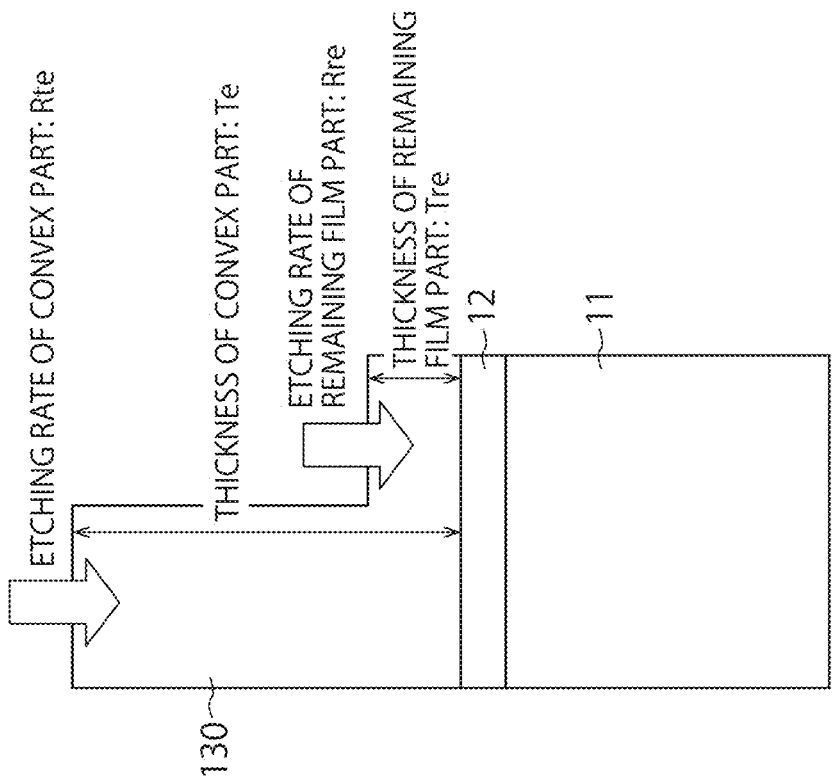
FIG. 6 is an explanatory diagram illustrating the pattern forming method in continuation from FIG. 5.
Figure 6:
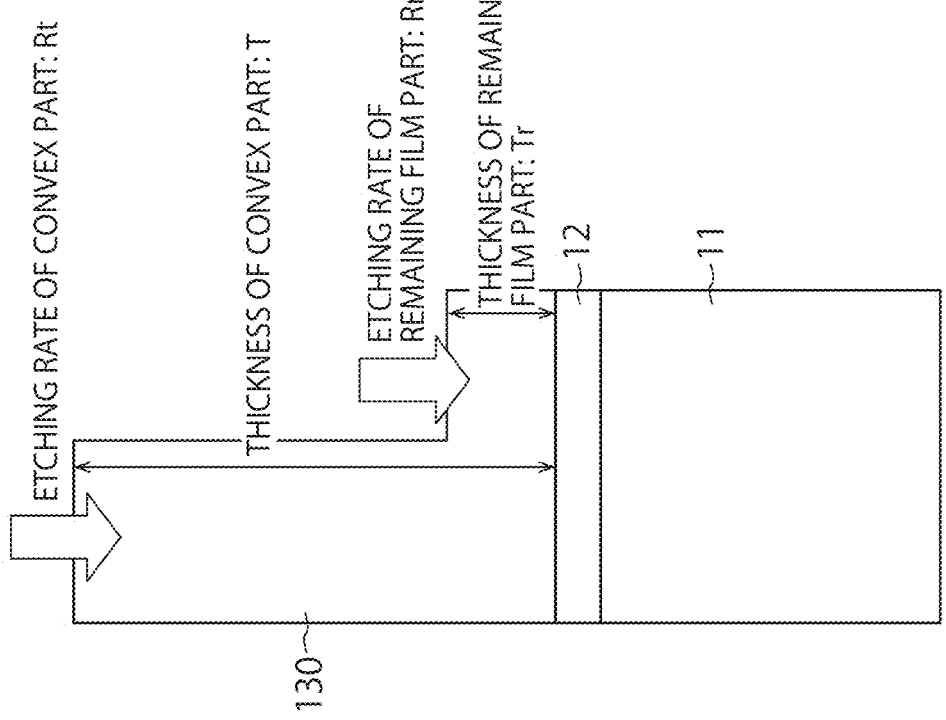

FIG. 6 is an explanatory diagram illustrating the pattern forming method in continuation from FIG. 5. A master template to be used for imprinting is determined next and the thickness of the remaining film part 132 satisfying the following expression is then determined on the basis of the height of a convex pattern on the master template (that is, the depth of a concave pattern adjacent to the convex pattern), the film thickness dependency of the dry etching rate illustrated in FIG. 4, and the film thickness dependency of the shrinkage ratio illustrated in FIG. 5 (Step S5).

$$(Te-Rte \times te)/(Rte/Rt) > T - Rt \times t \quad (1)$$

As illustrated in FIG. 6, Te in the mathematical expression (1) is the thickness of the convex part 131 after the electron beam irradiation. Rte is the dry etching rate of the convex part 131 after the electron beam irradiation and te is the time required to remove the remaining film part 132 by the dry etching after the electron beam irradiation. Rt is the dry etching rate of the convex part 131 before the electron beam irradiation, T is the thickness of the convex part 131 before the electron beam irradiation, and t is the time required to remove the remaining film part 132 by the dry etching before the electron beam irradiation. The definitions of the parameters in the mathematical expression (1) are same in the following explanations.

The left-hand side of the mathematical expression (1) indicates the effective thickness of the convex part 131 remaining when the remaining film part 132 has been removed by dry etching of the resist film 130 after the electron beam irradiation. The right-hand side of the mathematical expression (1) indicates the effective thickness of the convex part 131 remaining when the remaining film part 132 has been removed by dry etching of the resist film 130 before the electron beam irradiation. Rte/Rt in the left-hand side is a parameter for increasing the thickness of the convex part 131 remaining after the electron beam irradiation to equivalently indicate that the etching resistance of the convex part 131 is improved by the electron beam irradiation. The mathematical expression (1) shows that the effective thickness of the convex part 131 remaining when the remaining film part 132 has been removed by dry etching of the resist film 130 after the electron beam irradiation is larger than the effective thickness of the convex part 131 remaining when the remaining film part 132 has been removed by dry etching of the resist film 130 before the electron beam irradiation.

A thickness Tr (see FIG. 6) of the remaining film part 132 before the electron beam irradiation, satisfying the mathematical expression (1) to which FIGS. 4 and 5 are applied, and a determination example of the electron beam irradiation condition are explained.

It is assumed, for example, that the height of a convex pattern on the master template is 30 nm. In this case, the mathematical expression (1) is satisfied when 3 mC/cm$^2$ is determined as the irradiation amount of the electron beam and 5 nm is determined as the thickness Tr of the remaining film part 132 before the electron beam irradiation. On the other hand, the mathematical expression (1) is not satisfied when 6 mC/cm$^2$ is determined as the irradiation amount of the electron beam and 5 nm is determined as the thickness Tr.

Specifically, when a master template in which the height of a convex pattern is 30 nm is imprinted on a resist, T=27+Tr (nm) is obtained considering that the resist is shrunk by approximately 10% after UV curing of the resist.

Example in Case where the EB Irradiation Amount: 3 mC/Cm$^2$ and the Thickness Tr of the Remaining Film Part: 5 nm When the electron beam irradiation amount is 3 mC/cm$^2$ and the thickness Tr of the remaining film part 132 is 5 nm, the parameters related to the mathematical expression (1) are as follows.

T: 32 nm

T can be obtained by T=27+5.

Rt: 2.8 nm/min

Rt can be obtained as the dry etching rate corresponding to the film thickness of 5 nm in a case in which samples are irradiated with no electron beam (0 mC/cm$^2$) in FIG. 4.

Te: 27.2 nm

Te can be obtained by multiplying T=32 nm by 0.85 which is the shrinkage ratio in a case in which the film thickness is 32 nm and the electron beam irradiation amount is 3 mC/cm$^2$ in FIG. 5.

Rte: 2.3 nm/min

Rte can be obtained by interpolation calculation of the dry etching rate corresponding to the film thickness of 30 nm in a case in which the electron beam irradiation amount is 3 mC/cm$^2$ in FIG. 4.

Tre (the thickness of the remaining film part 132 after the electron beam irradiation illustrated in FIG. 6): 4 nm Tre can be obtained by multiplying Tr=5 nm by the shrinkage ratio corresponding to the film thickness of 5 nm in the case in which the electron beam irradiation amount is 3 mC/cm$^2$ in FIG. 5.

Rre (the dry etching rate of the remaining film part 132 after the electron beam irradiation illustrated in FIG. 6): 2.7 nm/min Rre can be obtained by interpolation calculation of the dry etching rate corresponding to the film thickness of 4 nm in the case in which the electron beam irradiation amount is 3 mC/cm$^2$ in FIG. 4.

t: 2 min

The parameter t can be obtained by (4 (nm)×1.3/2.7 (nm/min)) with setting an adjustment parameter OE for the thickness of the remaining film part 132 to absorb in-plane fluctuation of the thickness Tre of the remaining film part 132 to 1.3. The parameter te can be assumed to be the same as t.

*Rte/Rt:* 2.3/2.8=0.82

*(Te−Rte×te)/(Rte/Rt):* 27.5

*T−Rt×t:* 27

Since 27.5 is larger than 27, the mathematical expression (1) is satisfied when the electron beam irradiation amount is 3 mC/cm$^2$ and the thickness Tr of the remaining film part 132 is 5 nm.

Furthermore, since Rre: 2.7 nm/min is larger than Rte: 2.3 nm/min, the electron beam irradiation amount 3 mC/cm$^2$ in a case in which the thickness Tr of the remaining film part 132 is 5 nm is an electron beam irradiation condition that enables the decrease amount in the dry etching rate of the remaining film part 132 to be lower than the decrease amount in the dry etching rate of the convex part 131.

[Example in Case where the EB Irradiation Amount: 6 mC/Cm² and the Thickness Tr of the Remaining Film Part 132: 5 nm]

When the electron beam irradiation amount is 6 mC/cm² and the thickness Tr of the remaining film part 132 is 5 nm, the parameters related to the mathematical expression (1) are as follows. The parameters are obtained in the same manner as that in the case where the electron beam irradiation amount is 3 mC/cm² and the thickness Tr of the remaining film part 132 is 5 nm.

T: 32 nm
Rt: 2.8 nm/min
Te: 19 nm
Rte: 1.9 nm/min
Tre: 3 nm
Rre: 2.1 nm/min
t: 1.8 min
Rte/Rt: 1.9/2.8=0.68
(Te−Rte×te)/(Rte/Rt): 23
T−Rt×t: 27

Since 23 is smaller than 27, the mathematical expression (1) is not satisfied when the electron beam irradiation amount is 6 mC/cm² and the thickness Tr of the remaining film part 132 is 5 nm.

Figure 7:
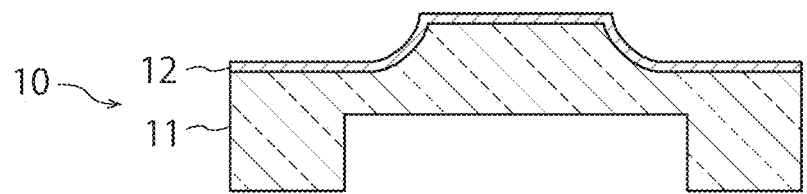
FIG. 7 is a sectional view illustrating the pattern forming method in continuation from FIG. 6.

FIG. 7 is a sectional view illustrating the pattern forming method in continuation from FIG. 6. After the thickness Tr of the remaining film part 132 is determined, the template substrate 10 is prepared as illustrated in FIG. 7 (Step S6).

Figure 8:
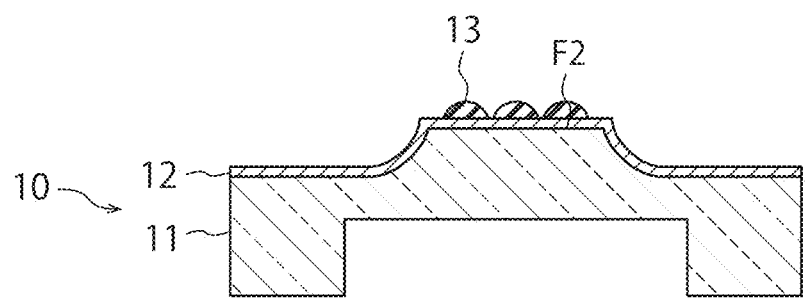
FIG. 8 is a sectional view illustrating the pattern forming method in continuation from FIG. 7.

FIG. 8 is a sectional view illustrating the pattern forming method in continuation from FIG. 7. After the template substrate 10 is prepared, a resist 13 is dripped on the protruded surface F2 of the template substrate 10 as illustrated in FIG. 8 (Step S7).

Figure 9:
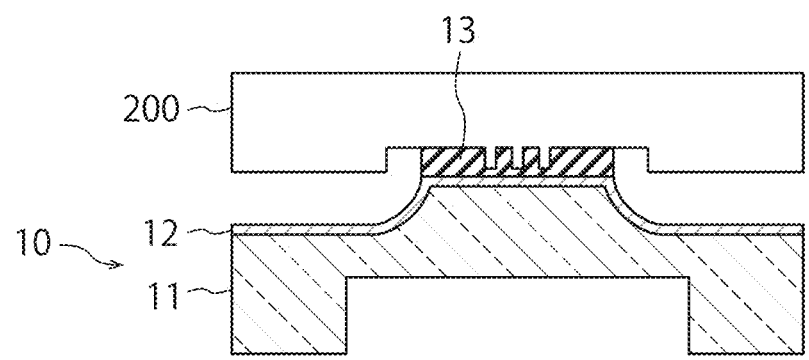
FIG. 9 is a sectional view illustrating the pattern forming method in continuation from FIG. 8.

FIG. 9 is a sectional view illustrating the pattern forming method in continuation from FIG. 8. After the resist 13 is dripped, the master template 200 in which the height of the convex pattern is known is pressed against the resist 13 as illustrated in FIG. 9. The resist 13 is cured by provision of an external stimulus such as ultraviolet light or heat (Step S8).

Figure 10:
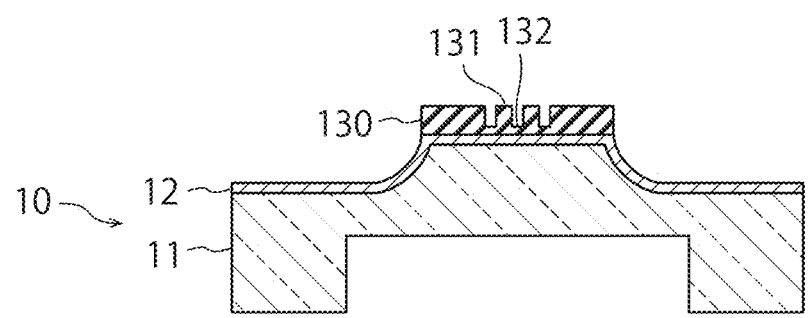
FIG. 10 is a sectional view illustrating the pattern forming method in continuation from FIG. 9.

FIG. 10 is a sectional view illustrating the pattern forming method in continuation from FIG. 9. After the template 200 is pressed against the resist 13 and the resist 13 is cured, the resist film 130 having the convex part 131 and the remaining film part 132 is formed by peeling the master template 200 from the resist 13 as illustrated in FIG. 10 (Step S9).

After the resist film 130 is formed, the template substrate 10 is carried in the combined processing apparatus 1. The template substrate 10 is first transferred to the film thickness measurement processor 4 and the film thickness measurement processor 4 measures the thicknesses of the convex part 131 and the remaining film part 132 of the resist film 130 (Step S10).

After the thicknesses of the convex part 131 and the remaining film part 132 are measured, the EB irradiation controller 53 determines the electron beam irradiation condition satisfying the mathematical expression (1) according to the measured film thicknesses (Step S11). For example, when the thickness of the convex part 131 is 32 nm and the thickness of the remaining film part 132 is 5 nm, the irradiation condition corresponding to the irradiation amount of 3 mC/cm² is determined as the electron beam irradiation condition in accordance with the example described above in which the electron beam irradiation amount is 3 mC/cm² and the thickness Tr of the remaining film part 132 is 5 nm. The irradiation condition may be the irradiation amount itself, or may be at least one of the accelerating voltage, the irradiation time, and the number of times of irradiation of the electron beam.

Figure 11:
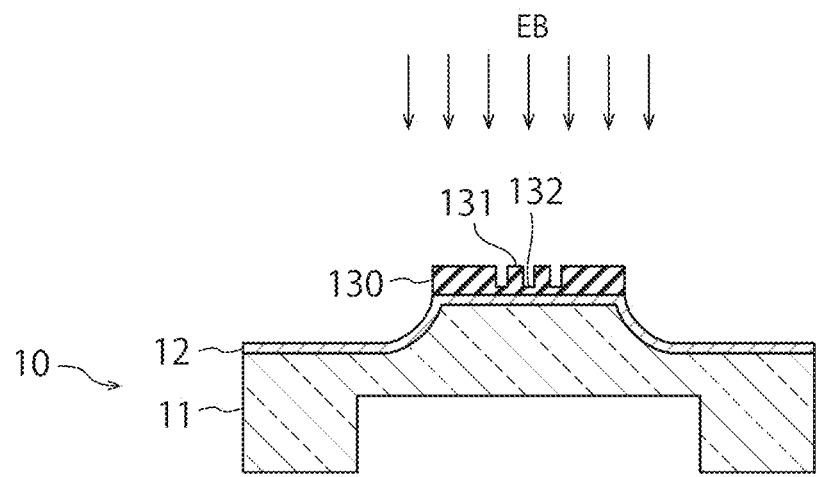
FIG. 11 is a sectional view illustrating the pattern forming method in continuation from FIG. 10.

FIG. 11 is a sectional view illustrating the pattern forming method in continuation from FIG. 10. After the electron beam irradiation condition is determined, the EB irradiation controller 53 causes the irradiating apparatus 52 to irradiate the resist film 130 with the electron beam in accordance with the determined irradiation condition as illustrated in FIG. 11 (Step S12). This decreases the dry etching rate of the resist film 130 so as to cause the decrease amount in the dry etching rate of the remaining film part 132 to be lower than the decrease amount in the dry etching rate of the convex part 131.

Figure 12:
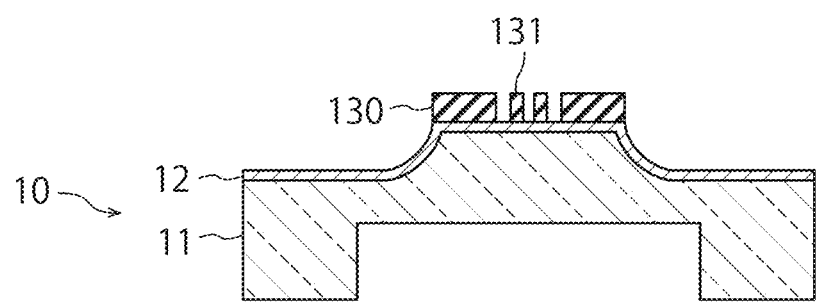
FIG. 12 is a sectional view illustrating the pattern forming method in continuation from FIG. 11.

FIG. 12 is a sectional view illustrating the pattern forming method in continuation from FIG. 11. After the resist film 130 is irradiated with the electron beam, the first dry etching processor 6 removes the remaining film part 132 by dry etching of the resist film 130 as illustrated in FIG. 12 (Step S13).

Figure 13:
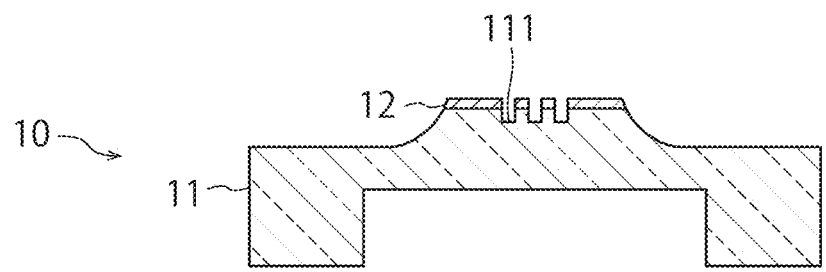
FIG. 13 is a sectional view illustrating the pattern forming method in continuation from FIG. 12.

FIG. 13 is a sectional view illustrating the pattern forming method in continuation from FIG. 12. After the remaining film part 132 is removed, the second dry etching processor 7 processes the conducting film 12 by dry etching using the resist film 130 from which the remaining film part 132 has been removed, as a mask, as illustrated in FIG. 13 (Step S14).

After the conducting film 12 is processed, the third dry etching processor 8 forms a pattern 111 on the template substrate 10 including the conducting film 12 processed by the dry etching using the resist film 130 from which the remaining film part 132 has been removed, as a mask, as illustrated in FIG. 13 (Step S15).

Figure 14:
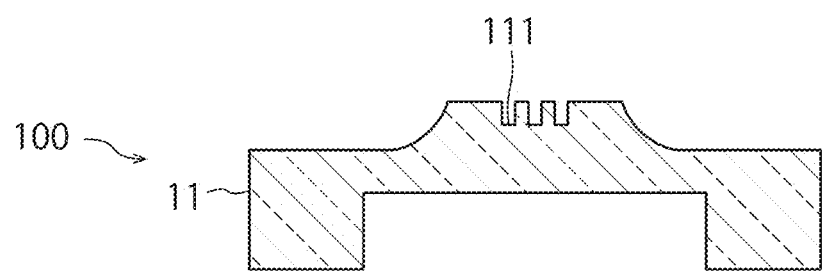
FIG. 14 is a sectional view illustrating the pattern forming method in continuation from FIG. 13.

FIG. 14 is a sectional view illustrating the pattern forming method in continuation from FIG. 13. After the pattern 111 is formed, the third dry etching processor 8 completely removes the conducting film 12 as illustrated in FIG. 14 (Step S16).

At the time of the dry etching of the resist film 130, the convex part 131 is also etched as well as the remaining film part 132. If the convex part 131 does not have a sufficient thickness at the time when the remaining film part 132 has been removed, the convex part 131 does not effectively function as a mask for the dry etching and not only the conducting film 12 at the location where the remaining film part 132 has been present but also the conducting film 12 under the convex part 131 is removed by the dry etching. This complicates appropriate formation of a pattern.

In contrast thereto, according to the present embodiment, the resist film 130 having the convex part 131 and the remaining film part 132 is irradiated with the electron beam to decrease the dry etching rate. Specifically, the dry etching rate is decreased so as to cause the decrease amount in the dry etching rate of the remaining film part 132 to be lower than the decrease amount in the dry etching rate of the convex part 131. This enables the convex part 131 to have a sufficient thickness at the time when the remaining film part 132 has been removed and therefore the convex part 131 can effectively function as a mask for the dry etching. Accordingly, the pattern can be appropriately formed.

Furthermore, according to the present embodiment, the decrease amount in the dry etching rate can be appropriately controlled by irradiating the resist film 130 with the electron beam in accordance with the irradiation condition determined based on the film thickness of the convex part 131, the film thickness of the remaining film part 132, and the film thickness dependency of the decrease amount in the dry etching rate.

The pattern can be more appropriately formed in compliance with the thickness of the remaining film part 132 and the electron beam irradiation condition satisfying the mathematical expression (1).

The thickness of the remaining film part 132 may be determined by the following expression instead of the mathematical expression (1).

$$(Te - Rte \times te - Rtec \times tc)/(Rtec/Rtc) > T - Rt \times t - Rtc \times tc \qquad (2)$$

In the mathematical expression (2), Rtec is the dry etching rate of the convex part 131 at the time of processing the conducting film 12 after the electron beam irradiation, and tc is the time required to remove the conducting film 12 by dry etching. Rtc is the dry etching rate of the convex part 131 at the time of processing the conducting film 12 before the electron beam irradiation. The rest of the parameters in the mathematical expression (2) is the same as that in the mathematical expression (1).

The mathematical expression (2) shows that the effective thickness of the convex part 131 remaining when the conducting film 12 has been removed by dry etching after the electron beam irradiation is larger than the effective thickness of the convex part 131 remaining when the conducting film 12 has been removed by dry etching before the electron beam irradiation. Rtec/Rtc in the left-hand side is a parameter for increasing the thickness of the convex part 131 remaining after the electron beam irradiation to equivalently indicate that the etching resistance of the convex part 131 is improved by the electron beam irradiation.

Although the thickness Tr to be determined of the remaining film part 132 is not directly indicated in the mathematical expression (2), the thickness Tr of the remaining film part 132 can be directly indicated by the following expression obtained by deforming the mathematical expression (2).

$$(Ac(T) \times S(T) - 1) \times T > (Ac(T) \times Re(T) - Rt) \times Tr \times OE/Re(Tr) \qquad (3)$$

In the mathematical expression (3), Ac(T) is the ratio of the dry etching rate of the conducting film 12 before the electron beam irradiation with respect to the dry etching rate of the conducting film 12 after the electron beam irradiation. Ac(T) depends on the thickness T of the convex part 131 before the electron beam irradiation. S(T) is the ratio Te/T of the thickness Te of the convex part 131 after the electron beam irradiation with respect to the thickness T of the convex part 131 before the electron beam irradiation. S(T) depends on the thickness T of the convex part 131 before the electron beam irradiation. While being the dry etching rate of the convex part 131 after the electron beam irradiation, Re(T) is represented differently from Rte in the mathematical expression (2) to show that Re(T) is a value depending on T. OE is an adjustment parameter for absorbing in-plane fluctuation of the thickness of the remaining film part 132 and is a constant not less than 1 and not more than 2. For example, OE is 1.3 assuming fluctuation of 30% in the thickness of the remaining film part 132. While being the dry etching rate of the remaining film part 132 after the electron beam irradiation, Re(Tr) is represented differently from Rre in FIG. 6 to show that Re(Tr) is a value depending on Tr.

The expression deformation from the mathematical expression (2) to the mathematical expression (3) is explained below. First, when the mathematical expression (2) is deformed to position the parameters related to the thicknesses Te and T of the convex part 131 in the left-hand side and position the parameters related to the times te and t required to remove the remaining film part 132 by dry etching in the right-hand side, the following expression is obtained.

$$(Rtc/Rtec)Te - T > -Rt \times t + (Rtc/Rtec)(Rte \times te) \qquad (4)$$

When it is assumed that te=t is established and Te/T=S(T) is assigned in the mathematical expression (4), the following expression is obtained.

$$[(Rtc/Rtec)S(T) - 1] \times T > [(Rtc/Rtec)Rte - Rt] \times t \qquad (5)$$

When Rtc/Rtec=A(T) is assigned and t=Tr/Rre is assigned in the mathematical expression (5), the following expression is obtained.

$$(A(T) \times S(T) - 1) \times T > (A(T) \times Rte - Rt) \times Tr/Rre \qquad (6)$$

When the representation of Rre is replaced by Re(Tr) and Tr=Tr×OE is assigned to absorb the in-plane fluctuation of the remaining film part 132 in the mathematical expression (6), the mathematical expression (3) is obtained.

The pattern can be formed more appropriately by applying the thickness of the remaining film part 132 and the electron beam irradiation condition in accordance with the mathematical expression (2).

At least a part of the combined processing apparatus according to the embodiment may be formed by hardware or software. In the case of using software, a program that can achieve at least a part of the functions of the combined processing apparatus may be stored in a recording medium such as a flexible disk or a CD-ROM, and the program is read into a computer and is executed by the computer. The recording medium is not limited to a removable medium such as a magnetic disk or an optical disk, but may be a fixed recording medium such as a hard disk device or a memory. Further, the program that can achieve at least a part of the functions of the combined processing apparatus may be distributed via a communication line such as the Internet (including wireless communication). In addition, the program can be distributed via a wired line or a wireless line such as the Internet in a state where the program is encrypted, modulated, or compressed, or can be distributed as a program stored in a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A pattern forming method comprising:
   forming an organic film on a processing target material, the organic film comprising a convex part and a remaining film part adjacent to the convex part, the remaining film part being thinner than the convex part;
   after forming the organic film with the convex part and the remaining film part, irradiating the organic film with an electron beam to decrease a dry etching rate of the organic film, a decrease amount in a dry etching rate of the remaining film part being lower than a decrease amount in a dry etching rate of the convex part;
   removing the remaining film part by dry etching of the organic film; and
   patterning the processing target material by dry etching using the organic film from which the remaining film part has been removed as a mask.

2. The method of claim 1, further comprising determining at least one of a thickness of the remaining film part and an irradiation condition of the electron beam in accordance with a following expression, wherein the patterning is performed according to the determined thickness of the remaining film part and/or the determined irradiation condition of the electron beam, $$(Te-Rte \times te)/(Rte/Rt) > T-Rt \times t$$

where Te is a thickness of the convex part after the electron beam irradiation, Rte is a dry etching rate of the convex part after the electron beam irradiation, te is a time required to remove the remaining film part by dry etching after the electron beam irradiation, Rt is a dry etching rate of the convex part before the electron beam irradiation, T is a thickness of the convex part before the electron beam irradiation, and t is a time required to remove the remaining film part by dry etching before the electron beam irradiation.

3. The method of claim 1, further comprising determining at least one of a thickness of the remaining film part and an irradiation condition of the electron beam in accordance with a following expression, wherein the patterning is performed according to the determined thickness of the remaining film part and/or the determined irradiation condition of the election beam, $$(Te-Rte \times te-Rtec \times tc)/(Rtec/Rtc) > T-Rt \times t-Rtc \times tc$$

where Te is a thickness of the convex part after the electron beam irradiation, Rte is a dry etching rate of the convex part after the electron beam irradiation, te is a time required to remove the remaining film part by dry etching after the electron beam irradiation, Rtec is a dry etching rate of the convex part at a time of processing a processing target film of the processing target material after the electron beam irradiation, tc is a time required to remove the processing target film by dry etching, Rtc is a dry etching rate of the convex part at a time of processing the processing target film before the electron beam irradiation, T is a thickness of the convex part before the electron beam irradiation, and t is a time required to remove the remaining film part by dry etching before the electron beam irradiation.

4. The method of claim 1, wherein the organic film is a resist film formed by imprint lithography.

5. The method of claim 4, wherein the processing target material comprises a processing target film including at least one of Cr, Mo, Ta, C, and Si on a surface.

6. The method of claim 1, wherein the processing target material comprises a processing target film including at least one of Cr, Mo, Ta, C, and Si on a surface.

7. The method of claim 6, wherein the processing target material comprises a quartz substrate under the processing target film.

8. The method of claim 1, further comprising obtaining a dependency of the decrease amount in a dry etching rate of the organic film due to electron beam irradiation on film thicknesses of the organic film, wherein the electron beam irradiation is performed on a basis of the dependency, a thickness of the convex part, and a thickness of the remaining film part.

9. The method of claim 8, wherein the organic film is a resist film formed by imprint lithography.

10. The method of claim 8, wherein the processing target material comprises a processing target film including at least one of Cr, Mo, Ta, C, and Si on a surface.

11. The method of claim 8, further comprising determining at least one of a thickness of the remaining film part and an irradiation condition of the electron beam in accordance with a following expression, wherein the patterning is performed according to the determined thickness of the remaining film part and/or the determined irradiation condition of the electron beam, $$(Te-Rte \times te)/(Rte/Rt) > T-Rt \times t$$

where Te is a thickness of the convex part after the electron beam irradiation, Rte is a dry etching rate of the convex part after the electron beam irradiation, te is a time required to remove the remaining film part by dry etching after the electron beam irradiation, Rt is a dry etching rate of the convex part before the electron beam irradiation, T is a thickness of the convex part before the electron beam irradiation, and t is a time required to remove the remaining film part by dry etching before the electron beam irradiation.

* * * * *